US008077462B2

(12) United States Patent
Barringer et al.

(10) Patent No.: US 8,077,462 B2
(45) Date of Patent: Dec. 13, 2011

(54) STRESS RELIEVED HOSE ROUTING TO LIQUID-COOLED ELECTRONICS RACK DOOR

(75) Inventors: Wayne A. Barringer, Poughkeepsie, NY (US); David P. Graybill, Poughkeepsie, NY (US); Madhusudan K. Iyengar, Poughkeepsie, NY (US); Roger R. Schmidt, Poughkeepsie, NY (US); James J. Steffes, Poughkeepsie, NY (US); Gerard V. Weber, Jr., Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 195 days.

(21) Appl. No.: 12/552,479

(22) Filed: Sep. 2, 2009

(65) Prior Publication Data
US 2011/0051372 A1   Mar. 3, 2011

(51) Int. Cl.
H05K 7/20   (2006.01)
(52) U.S. Cl. ............... 361/700; 361/679.47; 361/679.53; 361/698; 361/699; 312/223.1; 312/236; 165/104.33; 138/110
(58) Field of Classification Search ............. 361/679.47, 361/679.5, 679.52, 679.53, 690–692, 694, 361/695, 697–701
See application file for complete search history.

(56) References Cited

U.S. PATENT DOCUMENTS

| 3,853,148 | A | * | 12/1974 | De Vincent et al. .......... 138/110 |
| 4,011,905 | A |   | 3/1977  | Millard |
| 4,775,286 | A | * | 10/1988 | Gillette et al. ................. 414/687 |
| 4,893,670 | A |   | 1/1990  | Joshi et al. |
| 5,467,250 | A |   | 11/1995 | Howard et al. |
| 5,782,546 | A | * | 7/1998  | Iwatare .......................... 312/236 |
| 6,164,369 | A |   | 12/2000 | Stoller |
| 6,462,944 | B1 | * | 10/2002 | Lin ............................. 361/679.5 |
| 6,535,382 | B2 | * | 3/2003  | Bishop et al. ................. 361/690 |
| 6,760,221 | B2 |   | 7/2004  | Goth et al. |
| 6,775,137 | B2 |   | 8/2004  | Chu et al. |
| 7,086,247 | B2 |   | 8/2006  | Campbell et al. |
| 7,679,909 | B2 | * | 3/2010  | Spearing et al. .............. 361/699 |

(Continued)

OTHER PUBLICATIONS

"RackCooler"—A Cool Solution for X-Treme Density Rack Enclosure Systems, Liebert Corporation, Product Brochure, 8 pgs. (2001).

(Continued)

Primary Examiner — Jayprakash Gandhi
Assistant Examiner — Courtney Smith
(74) Attorney, Agent, or Firm — Dennis Jung, Esq.; Kevin P. Radigan, Esq.; Heslin Rothenberg Farley & Mesiti P.C.

(57) ABSTRACT

A cooling apparatus and method are provided which include an air-to-liquid heat exchanger and system coolant inlet and outlet plenums mounted to an electronics rack door along an edge of the door remote from the edge hingedly mounted to the rack. The plenums are in fluid communication with the heat exchanger and respectively include an inlet and outlet. Coolant supply and return hoses are disposed above the electronics rack and couple the inlet plenum to a coolant supply header and the outlet plenum to a coolant return header. The hoses are sufficiently long and flexible to open or close the door. A stress relief structure is attached to the top of the door and clamps the supply and return hoses in fixed relation to relieve stress on connect couplings at the ends of the hoses to the plenum inlet and outlet during opening or closing of the door.

20 Claims, 12 Drawing Sheets

U.S. PATENT DOCUMENTS

| | | |
|---|---|---|
| 2004/0177948 A1 | 9/2004 | Cho et al. |
| 2005/0231913 A1 | 10/2005 | Malone et al. |
| 2006/0232945 A1 * | 10/2006 | Chu et al. .................. 361/724 |
| 2009/0080173 A1 | 3/2009 | Porter et al. |
| 2009/0122488 A1 * | 5/2009 | Iyengar et al. .............. 361/700 |
| 2009/0154159 A1 * | 6/2009 | Graybill et al. ......... 362/249.02 |
| 2009/0225514 A1 * | 9/2009 | Correa et al. ................ 361/701 |

OTHER PUBLICATIONS

Teague, Paul E., "One Cool Machine", Design News for Mechanical and Design Engineers, Internet Article, 6 pgs. (Feb. 7, 2005).

* cited by examiner

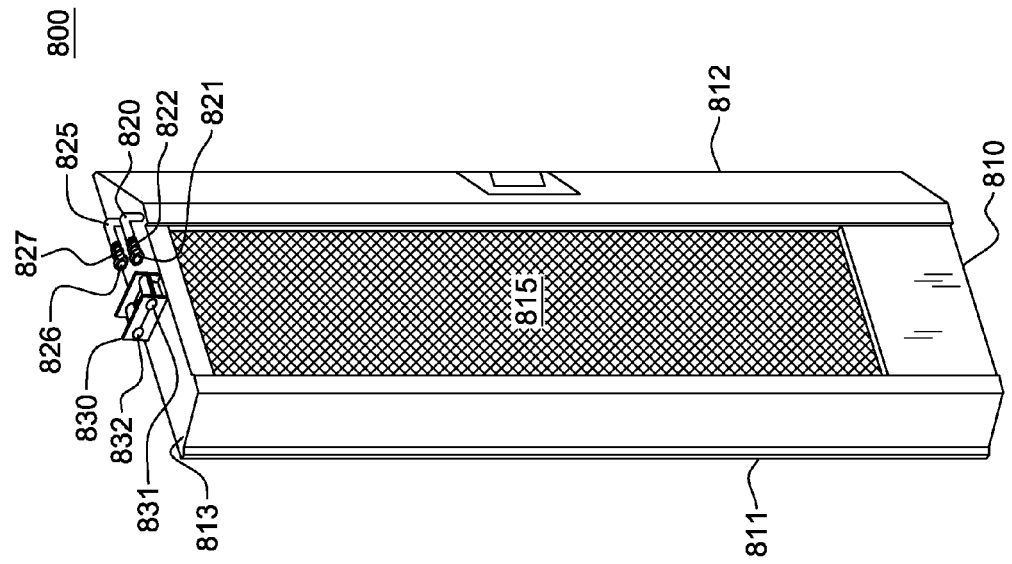
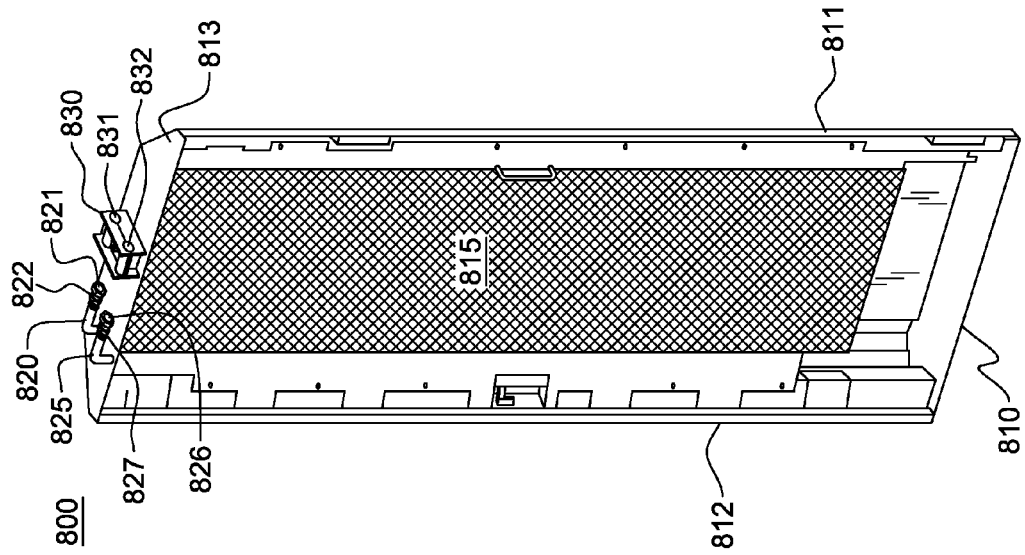

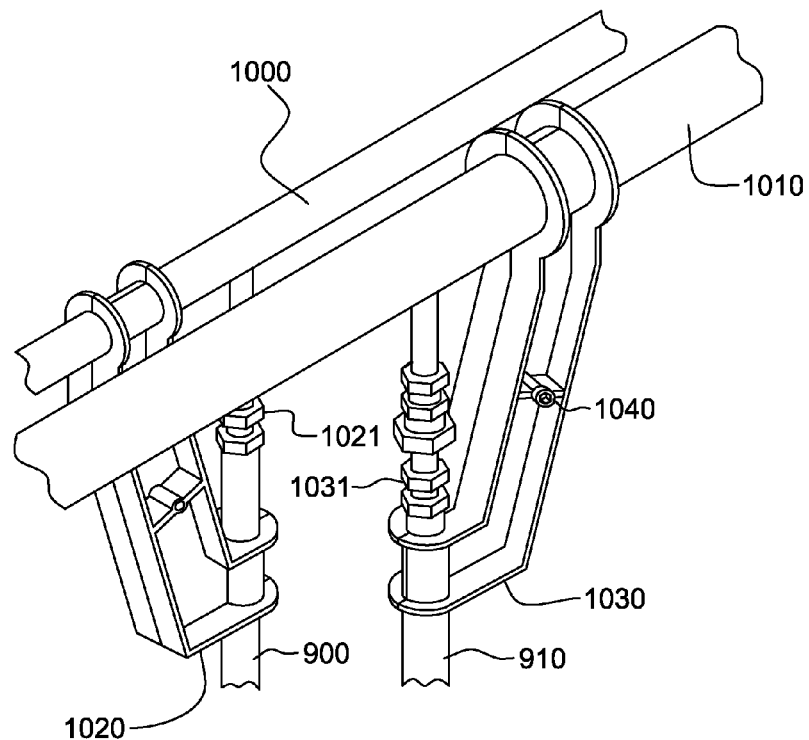
FIG. 10A
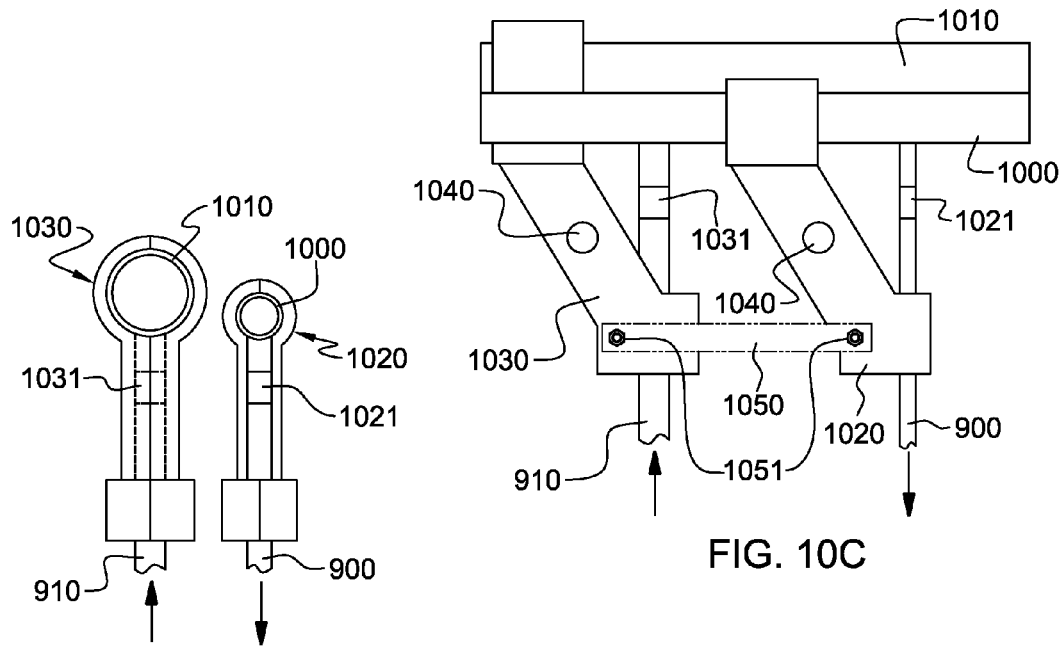
FIG. 10B
FIG. 10C

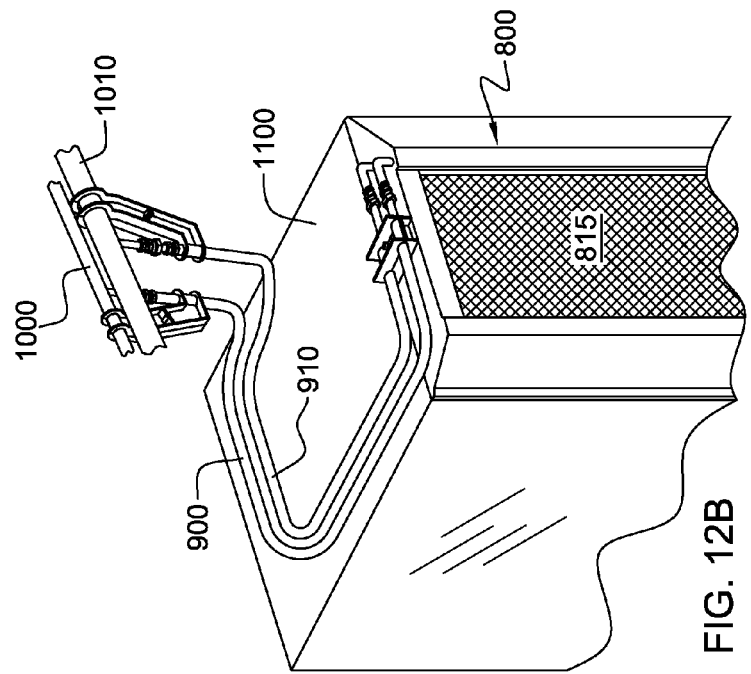
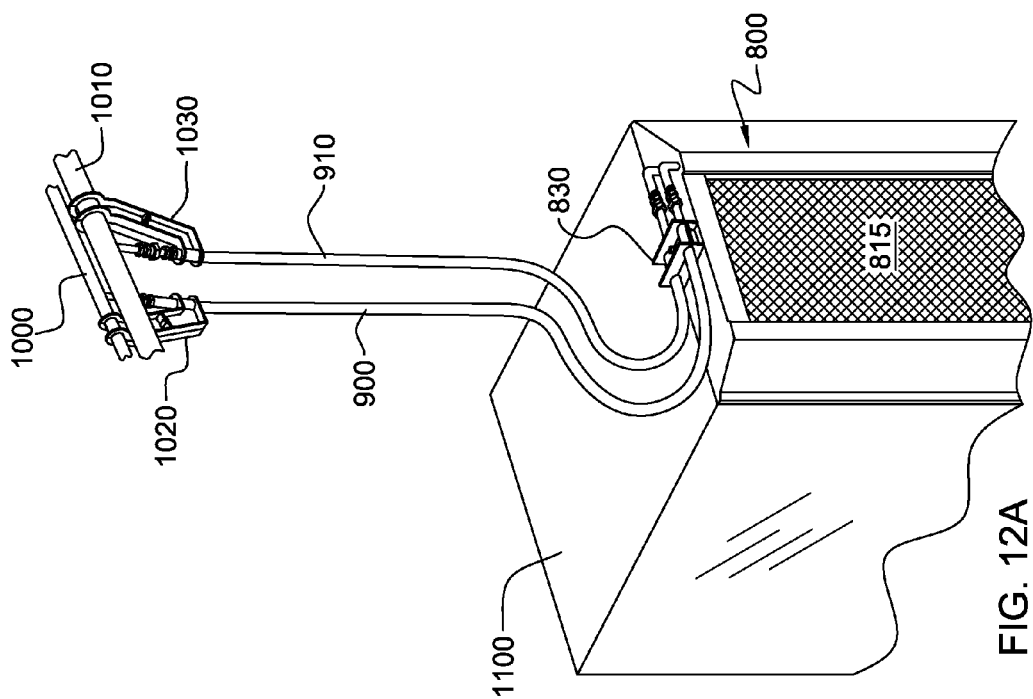

STRESS RELIEVED HOSE ROUTING TO LIQUID-COOLED ELECTRONICS RACK DOOR

BACKGROUND

The present invention relates in general to cooling apparatuses and methods for rack-mounted assemblages of individual electronics units, such as rack-mounted computer server units.

The power dissipation of integrated circuit chips, and the modules containing the chips, continues to increase in order to achieve increases in processor performance. This trend poses a cooling challenge at both module and system level. Increased airflow rates are needed to effectively cool high power modules and to limit the temperature of the air that is exhausted into the computer center.

In many large server applications, processors along with their associated electronics (e.g., memory, disk drives, power supplies, etc.) are packaged in removable drawer configurations stacked within a rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer by providing greater airflow, through the use of a more powerful air moving device or by increasing the rotational speed (i.e., RPMs) of an existing air moving device. However, this approach is becoming problematic at the rack level in the context of a computer installation (i.e., data center).

The sensible heat load carried by the air exiting the rack is stressing the availability of the room air-conditioning to effectively handle the load. This is especially true for large installations with "server farms" or large banks of computer racks close together. In such installations, liquid cooling (e.g., water cooling) is an attractive technology to manage the higher heat fluxes. The liquid absorbs the heat dissipated by the components/modules in an efficient manner. Typically, the heat is ultimately transferred from the liquid to an outside environment, whether air or liquid cooled.

BRIEF SUMMARY

In one aspect, the shortcomings of the prior art overcome and additional advantages are provided through the provision of a cooling apparatus for an electronics rack. The cooling apparatus includes an air-to-liquid heat exchanger mounted to a door, which is vertically, hingedly mounted along a first edge to the electronics rack at one of an air inlet side or an air outlet side thereof, wherein air moves through the electronics rack from the air inlet side to the air outlet side. The cooling apparatus further includes a system coolant inlet plenum, a system coolant outlet plenum, a system coolant supply hose, a system coolant return hose, and a stress relief structure. The system coolant inlet plenum and the system coolant outlet plenum are mounted to the door along a second edge thereof in opposing relation with and remote from the first edge of the door hingedly mounted to the electronics rack. The system coolant inlet plenum and the system coolant outlet plenum are in fluid communication with the air-to-liquid heat exchange assembly and facilitate passage of system coolant therethrough. The system coolant inlet plenum includes a coolant inlet and the system coolant outlet plenum includes a coolant outlet. The system coolant supply hose and the system coolant return hose are disposed above the electronics rack, with the system coolant supply hose being coupled at a first end to the coolant inlet of the system coolant inlet plenum and at a second end to a system coolant supply header of a data center containing the electronics rack, and with the system coolant return hose being coupled at a first end to the coolant outlet of the system coolant outlet plenum and at a second end to a system coolant return header of the data center. The system coolant supply hose and the system coolant return hose are each sufficiently flexible and of sufficient length to allow opening and closing of the door. The stress relief structure is attached to an upper portion of the door and is clamped to the system coolant supply hose and to the system coolant return hose to hold the first ends thereof in fixed relation to each other at the upper portion of the door and to relieve stress on connect couplings at the first ends thereof to the coolant inlet and coolant outlet, respectively, of the system coolant inlet and outlet plenums during opening or closing of the door.

In another aspect, a cooled electronics system is provided which includes an electronics rack and a cooling apparatus for the electronics rack. The electronics rack includes: an air inlet side and an air outlet side, the air inlet and air outlet sides respectively enabling ingress and egress of external air; at least one electronics subsystem requiring cooling; at least one air-moving device, the at least one air-moving device being capable of causing external air to flow from the air inlet side of the electronics rack across the at least one electronics subsystem, to the air outlet side of the electronics rack; and an outlet door hingedly mounted along a first edge thereof to the electronics rack at the air outlet side of the electronics rack, the outlet door having an opening therein allowing egress of air from the electronics rack. The cooling apparatus includes: an air-to-liquid heat exchange assembly mounted to reside within the opening in the outlet door; a system coolant inlet plenum and a system coolant outlet plenum mounted to the outlet door along a second edge thereof in opposing relation with and remote from the first edge of the outlet door hingedly mounted to the electronics rack, the system coolant inlet plenum and the system coolant outlet plenum being in fluid communication with the air-to-liquid heat exchange assembly and facilitating passage of system coolant therethrough, the system coolant inlet plenum comprising a coolant inlet and the system coolant outlet plenum comprising a coolant outlet; a system coolant supply hose and a system coolant return hose disposed above the electronics rack, the system coolant supply hose being coupled at a first end to the coolant inlet of the system coolant inlet plenum and at a second end to a system coolant supply header of a data center containing the electronics rack, the system coolant return hose being coupled at a first end to the coolant outlet of the system coolant outlet plenum and at a second end to a system coolant return header of the data center, wherein the system coolant supply hose and the system coolant return hose are each sufficiently flexible and of sufficient length to allow for opening or closing of the outlet door; and a stress relief structure attached to an upper portion of the outlet door and clamped to the system coolant supply hose and the system coolant return hose to hold the first end thereof in fixed relation to each other at the upper portion of the outlet door and to relieve stress on connect couplings at the first ends thereof to the coolant inlet and the coolant outlet, respectively, of the system coolant inlet and outlet plenums during opening or closing of the outlet door.

In a further aspect, a method of fabricating a cooling apparatus for an electronics rack is provided. The method includes: mounting an air-to-liquid heat exchange assembly to a door of the electronics rack, the door being vertically, hingedly mounted along a first edge thereof to the electronics rack at one of an air inlet side or an air outlet side of the electronics rack, wherein air moves through the electronics rack from the air inlet side to the air outlet side; mounting a system coolant inlet plenum and a system coolant outlet plenum to the door along a second edge thereof in opposing relation with and remote from the first edge of the door hingedly mounted to the electronics rack, the system coolant inlet plenum and the system coolant outlet plenum being in fluid communication with the air-to-liquid heat exchange assembly for facilitating passage of system coolant therethrough, the system coolant inlet plenum comprising a coolant inlet and the system coolant outlet plenum comprising a coolant outlet; coupling a first end of a system coolant supply hose to the coolant inlet of the system coolant inlet plenum and a second end thereof to a system coolant supply header of the data center containing the electronics rack, and coupling a first end of a system coolant return hose thereof to the coolant outlet of the system coolant outlet plenum and a second end thereof to a system coolant return header of the data center, wherein the system coolant supply hose and the system coolant return hose are sufficiently flexible and of sufficient length to allow opening or closing of the door; and attaching a stress relief structure to an upper portion of the door and clamping the stress relief structure to the system coolant supply hose and to the system coolant return hose to hold the first ends thereof in fixed relation to each other at the upper portion of the door and to relieve stress on connect couplings at the first ends thereof to the coolant inlet and coolant outlet, respectively, of the system coolant inlet and outlet plenums during opening or closing of the door.

Further, additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIGS. 8A & 8B are isometric views of one embodiment of an electronics rack door with a cooling apparatus (partially shown) mounted thereto viewed from the interior and exterior thereof, respectively, in accordance with an aspect of the present invention;

FIG. 10A illustrates one embodiment of system coolant supply hose and system coolant return hose connections to a system coolant supply header and system coolant return header, respectively, and showing one embodiment of a supply manifold stress relief structure and a return manifold stress relief structure, in accordance with an aspect of the present invention;

FIG. 10B is a cross-sectional elevational representation of the system coolant supply hose and the system coolant return hose connections to the system coolant supply header and system coolant return header, respectively of FIG. 10A, and illustrating details of the supply manifold stress relief structure and return manifold stress relief structure, in accordance with an aspect of the present invention;

FIG. 10C is an elevational view of one embodiment of system coolant supply hose and system coolant return hose connections to the system coolant supply header and system coolant return header, respectively, and further illustrating the supply manifold stress relief structure and return manifold stress relief structure of the cooling apparatus, in accordance with an aspect of the present invention;

FIG. 12A is an isometric view of one embodiment of an electronics rack, an electronics rack door, and a cooling apparatus mounted thereto, in accordance with an aspect of the present invention;

FIG. 12B depicts an alternate embodiment of an electronics rack, electronics rack door and cooling apparatus mounted thereto, in accordance with an aspect of the present invention.

DETAILED DESCRIPTION

Figure 1:
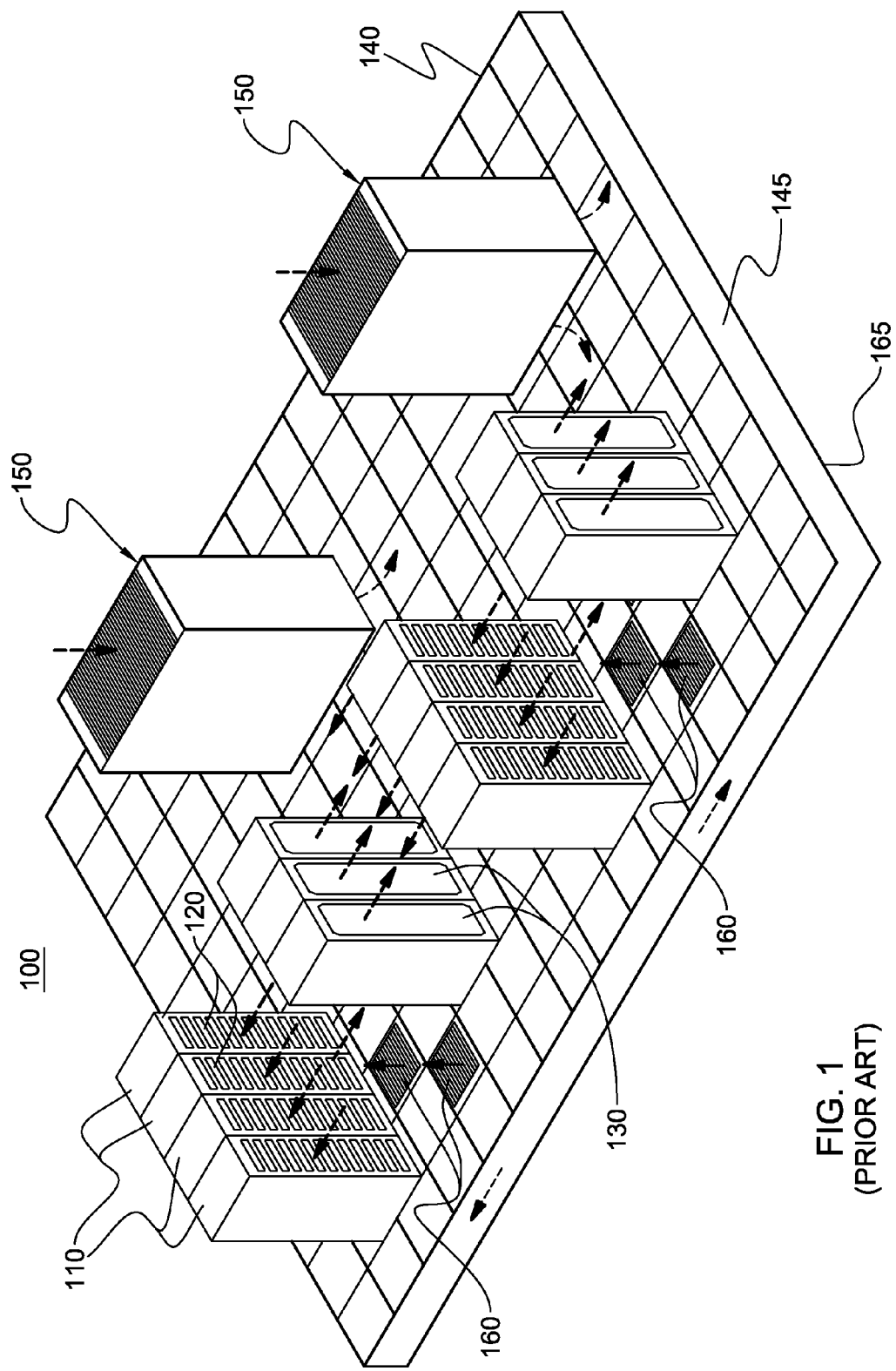
FIG. 1 depicts one embodiment of a conventional raised floor layout of an air-cooled data center.

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand alone computer processor having high, mid or low end processing capability. In one embodiment, an electronics rack may comprise multiple electronics subsystems, each having one or more heat generating components disposed therein requiring cooling. "Electronics subsystem" refers to any sub-housing, blade, book, drawer, node, compartment, etc., having one or more heat generating electronic components disposed therein. Each electronics subsystem of an electronics rack may be movable or fixed relative to the electronics rack, with the rack-mounted electronics drawers of a multi-drawer rack unit and blades of a blade center system being two examples of subsystems of an electronics rack to be cooled.

"Electronic component" refers to any heat generating electronic component of, for example, a computer system or other electronics unit requiring cooling. By way of example, an electronic component may comprise one or more integrated circuit dies and/or other electronic devices to be cooled, including one or more processor dies, memory dies and memory support dies. As a further example, the electronic component may comprise one or more bare dies or one or more packaged dies disposed on a common carrier. Unless otherwise specified herein, the term "liquid-cooled cold plate" refers to any conventional thermally conductive structure having a plurality of channels or passageways formed therein for flowing of liquid coolant therethrough. In addition, "metallurgically bonded" refers generally herein to two components being welded, brazed or soldered together by any means.

As used herein, "air-to-liquid heat exchange assembly" means any heat exchange mechanism characterized as described herein through which liquid coolant can circulate; and includes, one or more discrete air-to-liquid heat exchangers coupled either in series or in parallel. An air-to-liquid heat exchanger may comprise, for example, one or more coolant flow paths, formed of thermally conductive tubings (such as copper or other tubing) in thermal or mechanical contact with a plurality of air-cooled cooling fins. Size, configuration and construction of the air-to-liquid heat exchange assembly and/or air-to-liquid heat exchanger thereof can vary without departing from the scope of the invention disclosed herein. A "liquid-to-liquid heat exchanger" may comprise, for example, two or more coolant flow paths, formed of thermally conductive tubings (such as copper or other tubing) in thermal communication with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of facility coolant and system coolant is water. However, the concepts disclosed herein are readily adapted to use with other types of coolant on the facility side and/or on the system side. For example, one or more of the coolants may comprise a brine, a fluorocarbon liquid, a liquid metal, or other similar coolant, or refrigerant, while still maintaining the advantages and unique features of the present invention. As a specific example, the concepts described hereinbelow with reference to FIGS. 8A-13B employ water as facility coolant and a refrigerant as system coolant.

Reference is made below to the drawings (which are not drawn to scale to facilitate understanding of the invention), wherein the same reference numbers used throughout different figures designate the same or similar components.

As shown in FIG. 1, in a raised floor layout of an air cooled computer installation or data center 100 typical in the prior art, multiple electronics racks 110 are disposed in one or more rows. A computer installation such as depicted in FIG. 1 may house several hundred, or even several thousand microprocessors. In the arrangement of FIG. 1, chilled air enters the computer room via floor vents from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have an air moving device (e.g., fan or blower) to provide forced inlet-to-outlet airflow to cool the electronic components within the drawer(s) of the rack. The supply air plenum 145 provides conditioned and cooled air to the air-inlet sides of the electronics racks via perforated floor tiles 160 disposed in a "cold" air aisle of the data center. The conditioned and cooled air is supplied to plenum 145 by one or more air-conditioning units 150, also disposed within the computer installation 100. Room air is taken into each conditioned air unit 150 near an upper portion thereof. This room air comprises in part exhausted air from the "hot" air aisles of the data center defined by opposing air outlet sides 130 of the electronics racks 110.

Figure 2:
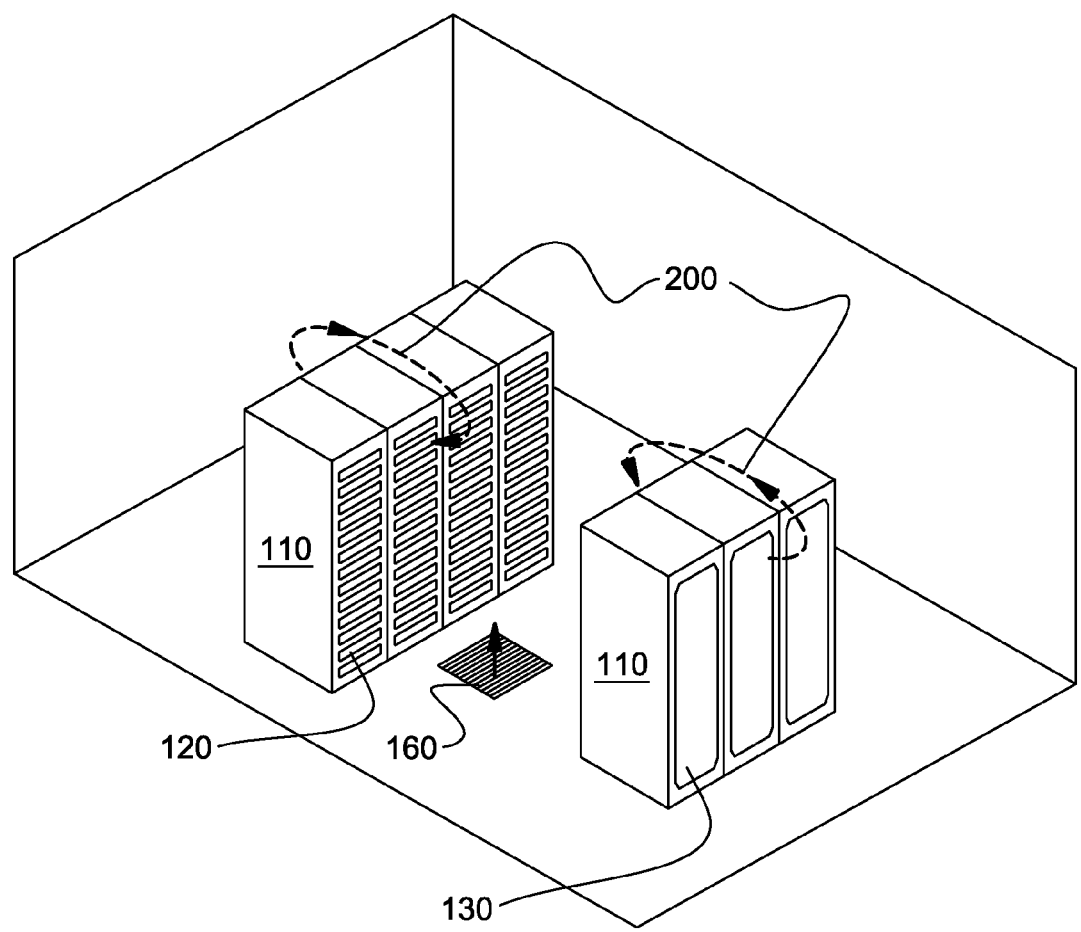
FIG. 2 depicts one problem addressed by the present invention, showing recirculation of airflow patterns in one implementation of a raised floor layout of an air-cooled data center.

Due to the ever increasing airflow requirements through electronics racks, and limits of air distribution within the typical computer room installation, recirculation problems within the room may occur. This is shown in FIG. 2 for a raised floor layout, wherein hot air recirculation 200 occurs from the air outlet sides 130 of the electronics racks back to the cold air aisle defined by the opposing air inlet sides 120 of the electronics rack. This recirculation can occur because the conditioned air supplied through tiles 160 is typically only a fraction of the airflow rate forced through the electronics racks by the air moving devices disposed therein. This can be due, for example, to limitations on the tile sizes (or diffuser flow rates). The remaining fraction of the supply of inlet side air is often made up by ambient room air through recirculation 200. This recirculating flow is often very complex in nature, and can lead to significantly higher rack unit inlet temperatures than might be expected.

The recirculation of hot exhaust air from the hot aisle of the computer room installation to the cold aisle can be detrimental to the performance and reliability of the computer system(s) or electronic system(s) within the racks. Data center equipment is typically designed to operate with rack air inlet temperatures in the 18-35° C. range. For a raised floor layout such as depicted in FIG. 1, however, temperatures can range from 15-20° C. at the lower portion of the rack, close to the cooled air input floor vents, to as much as 45-50° C. at the upper portion of the electronics rack, where the hot air can form a self-sustaining recirculation loop. Since the allowable rack heat load is limited by the rack inlet air temperature at the "hot" part, this temperature distribution correlates to an inefficient utilization of available air conditioning capability. Computer installation equipment almost always represents a high capital investment to the customer. Thus, it is of significant importance, from a product reliability and performance view point, and from a customer satisfaction and business perspective, to achieve a substantially uniform temperature across the air inlet side of the rack unit. The efficient cooling of such computer and electronic systems, and the amelioration of localized hot air inlet temperatures to one or more rack units due to recirculation of air currents, are addressed by the apparatuses and methods disclosed herein.

Figure 3:
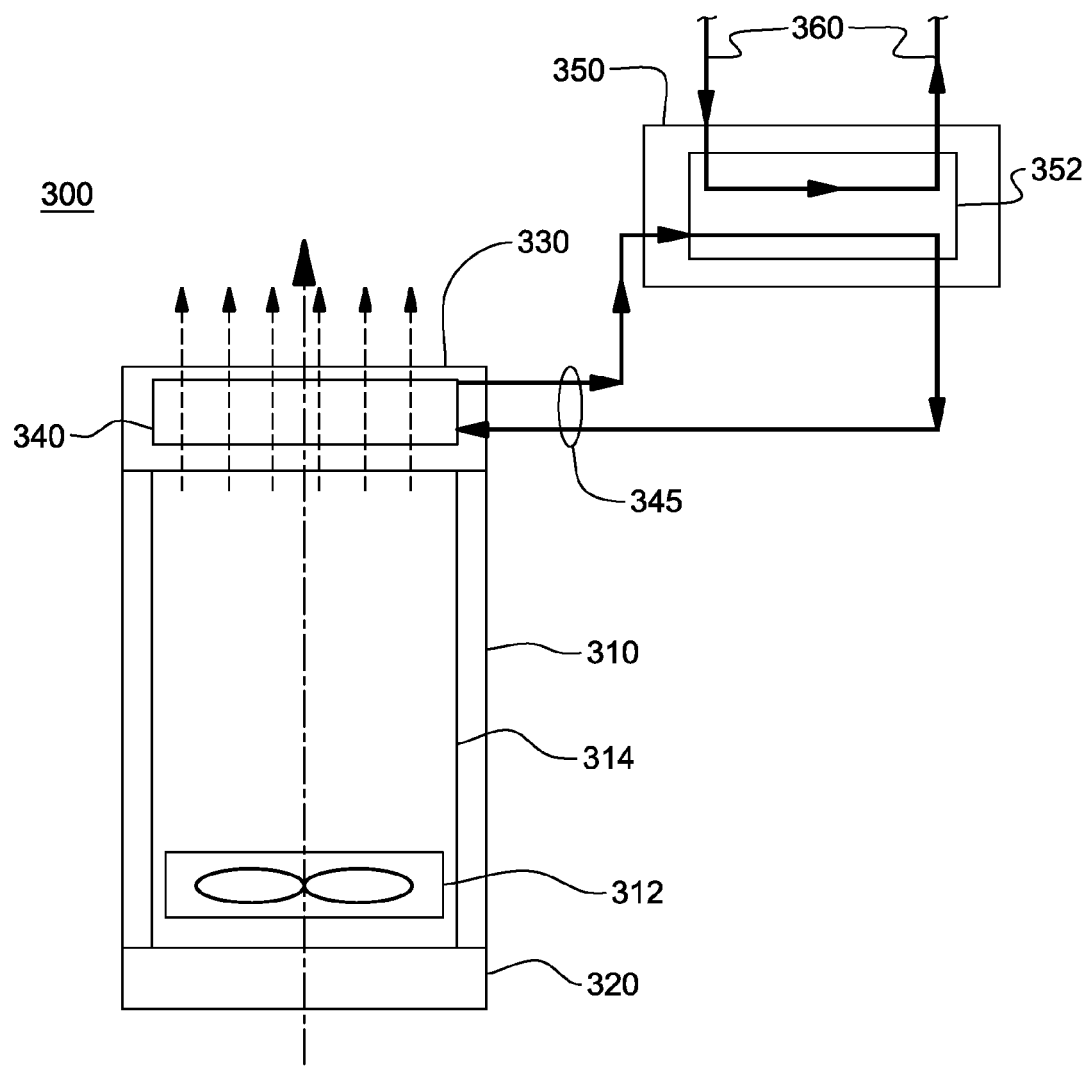
FIG. 3 is a top plan view of one embodiment of an electronics rack with an air-to-liquid heat exchanger mounted to an outlet door thereof, in accordance with one aspect of the present invention.

FIG. 3 depicts one embodiment of a cooled electronics system, generally denoted 300, in accordance with an aspect of the present invention. In this embodiment, electronics system 300 includes an electronics rack 310 having an inlet door 320 and an outlet door 330, which respectively have openings to allow for the ingress and egress of external air, respectively, through the air inlet side and air outlet side of electronics rack 310. The system further includes at least one air-moving device 312 for moving external air across at least one electronics subsystem 314 positioned within the electronics rack. Disposed within outlet door 330 is an air-to-liquid heat exchanger 340 across which the inlet-to-outlet airflow through the electronics rack passes. A cooling unit 350 is used to buffer the air-to-liquid heat exchanger from facility coolant 360, for example, provided via a coolant distribution unit (not shown). Air-to-liquid heat exchanger 340 removes heat from the exhausted inlet-to-outlet airflow through the electronics rack via the system coolant, for ultimate transfer in cooling unit 350 to facility coolant 360 via liquid-to-liquid heat exchanger 352 disposed therein. This cooling apparatus advantageously reduces heat load on existing air-conditioning units within the data center, and facilitates cooling of electronics racks by cooling the air egressing from the electronics rack and thus cooling any air recirculating to the air inlet side thereof As shown in FIG. 3, a system coolant loop 345 couples air-to-liquid heat exchanger 340 to cooling unit 350. In one embodiment, the system coolant employed is water. By way of example, such a system is described in U.S. Pat. No. 7,385,810 B2, issued Jun. 10, 2008, and entitled "Apparatus and Method for Facilitating Cooling of an Electronics Rack Employing a Heat Exchange Assembly Mounted to an Outlet Door Cover of the Electronics Rack".

In this patent, the inlet and outlet plenums mount within the door and are coupled to supply and return manifolds disposed beneath a raised floor. Presented hereinbelow are enhanced variations on such an outlet door heat exchanger. Specifically, disclosed hereinbelow is an air-to-liquid heat exchanger which employs a pumped refrigerant as the system coolant. Connection hoses for the pumped refrigerant system are, in one embodiment, metal braided hoses, and the system coolant supply and return headers for the pumped refrigerant system are mounted overhead relative to the electronics racks within the data center. Thus, for the pumped refrigerant system described below, system coolant enters and exits the respective system coolant inlet and outlet plenums at the top of the door and rack. Further, because pumped refrigerant is employed, the hose and couplings used in the pumped refrigerant systems described below are affixed at both ends, i.e., to the system coolant plenums on one end and to the overhead supply and return headers on the other end.

Advantageously, the coolant supply and return hoses disclosed herein reside over the electronics rack, are sufficiently flexible, at least partially looped and are sized to facilitate opening and closing of the door containing the air-to-liquid heat exchanger. Additionally, structures are provided at the ends of the hoses to relieve stress at the hose ends which results from opening or closing of the door.

Figure 4:
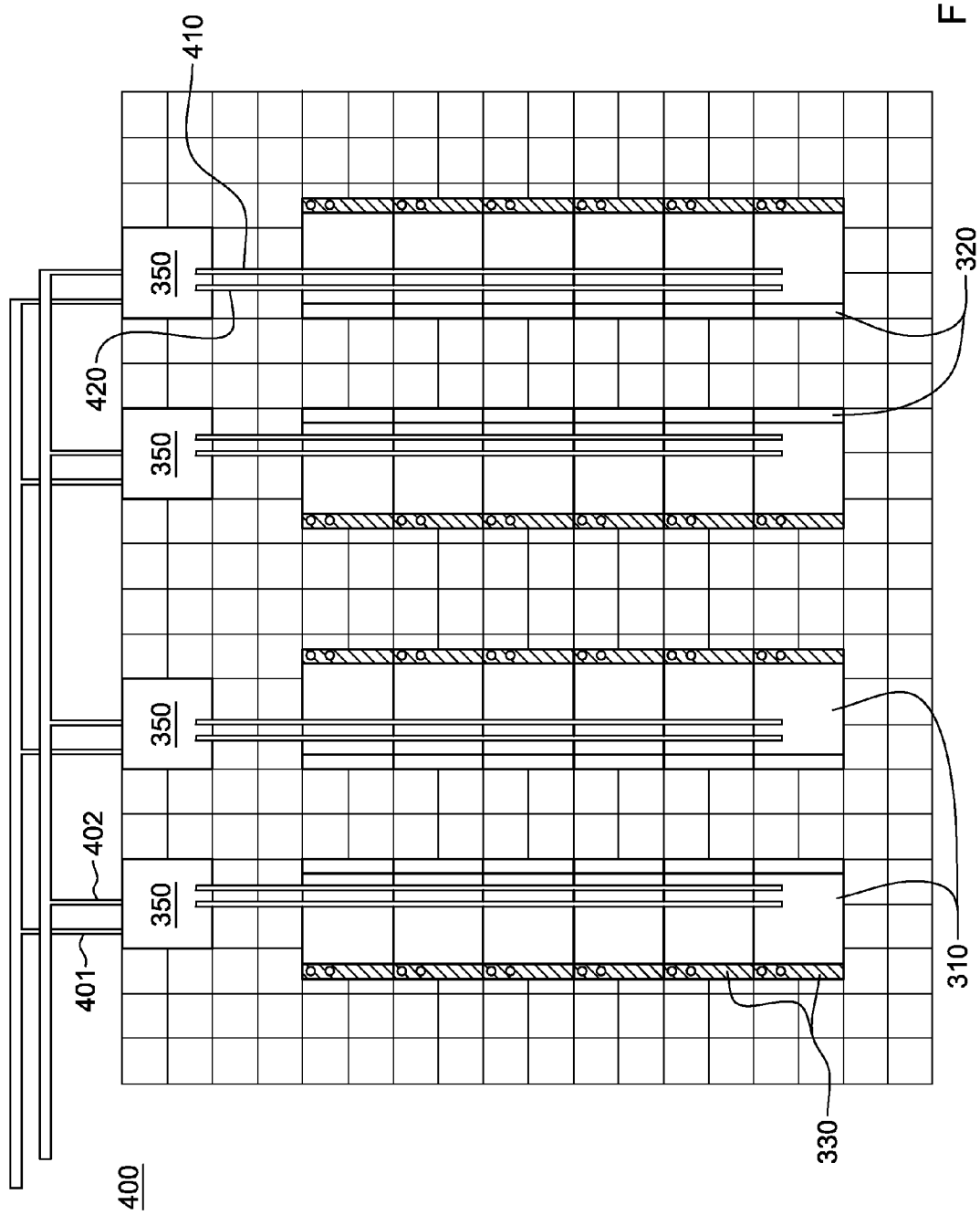
FIG. 4 is a top plan view of one embodiment of a data center employing cooling apparatuses comprising outlet door air-to-liquid heat exchangers, in accordance with an aspect of the present invention.

FIG. 4 is a plan view of one embodiment of a data center, generally denoted 400, employing cooled electronics systems, in accordance with an aspect of the present invention. Data center 400 includes a plurality of rows of electronics racks 310, each of which includes an inlet door 320 and a hinged outlet door 330, such as described above in connection with the embodiment of FIG. 3. Each outlet door 330 supports an air-to-liquid heat exchanger and system coolant inlet and outlet plenums as described further hereinbelow. Multiple cooling units 350, referred to hereinbelow as pumping units, are disposed within the data center (along with one or more air-conditioning units (not shown)). In this embodiment, each pumping unit forms a system coolant distribution subsystem with one row of a plurality of electronics racks. Each pumping unit includes a liquid-to-liquid heat exchanger where heat is transferred from a system coolant loop to a facility coolant loop. Chilled facility coolant, such as water, is received via facility coolant supply line 401, and is returned via facility coolant return line 402. System coolant, such as refrigerant, is provided via a system coolant supply header 410 extending over the respective row of electronics racks, and is returned via a system coolant return header 420 also extending over the respective row of electronics racks. In one embodiment, the system coolant supply and return headers 410, 420 are hard-plumbed within the data center, and preconfigured to align over and include branch lines extending towards electronics racks of a respective row of electronics racks.

Figure 5:
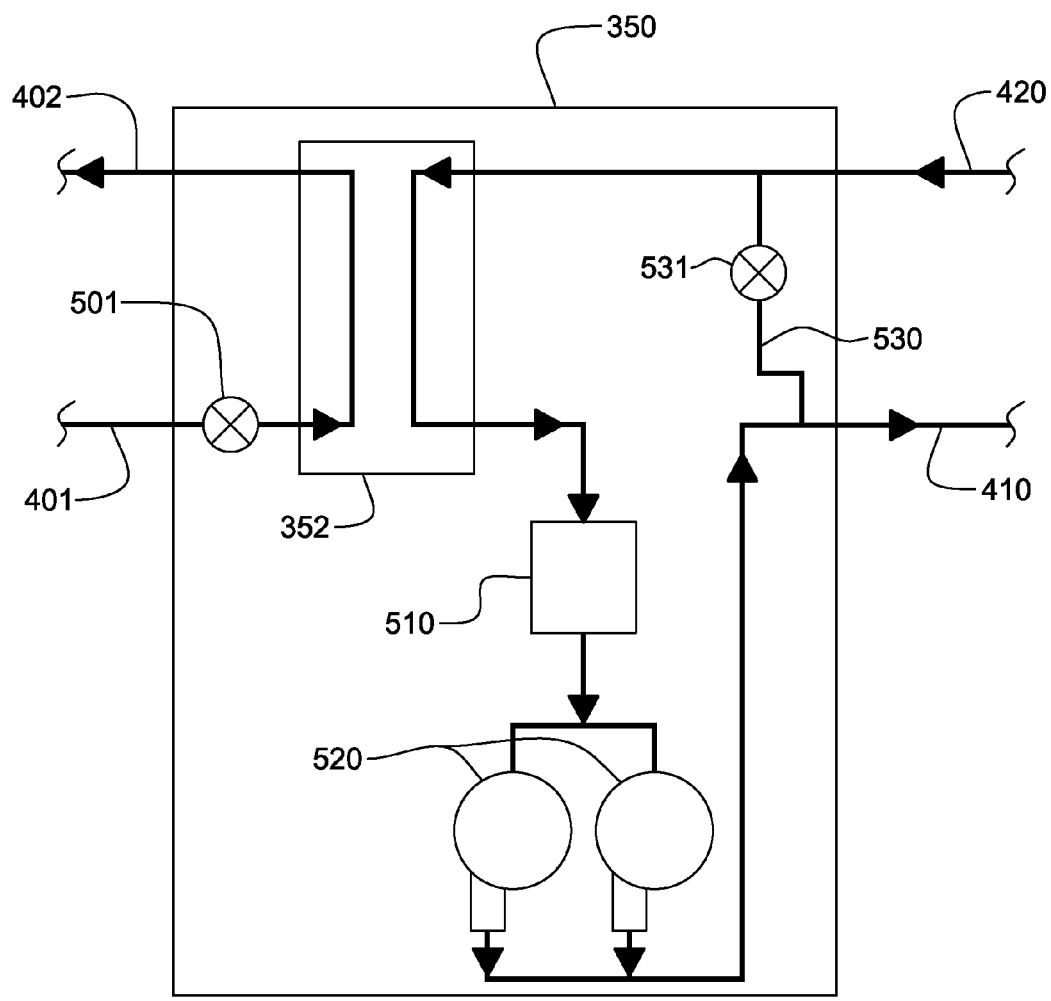
FIG. 5 is a schematic of one embodiment of a coolant distribution unit to be used in the data center of FIG. 4, in accordance with an aspect of the present invention.

FIG. 5 depicts one embodiment of a cooling unit 350 for the data center 400 of FIG. 4. Liquid-to-liquid heat exchanger 352 condenses a vapor-liquid refrigerant mixture passing through the system coolant loop comprising system coolant supply header 410 and system coolant return header 420. (In one embodiment, the system coolant has undergone heating and partial vaporization within the respective air-to-liquid heat exchangers disposed within the outlet doors of the electronics racks.) The facility coolant loop of liquid-to-liquid heat exchanger 352 comprises facility coolant supply line 401 and facility coolant return line 402, which in one embodiment, provide chilled facility water to the liquid-to-liquid heat exchanger. A control valve 501 may be employed in facility coolant supply line 401 to control facility coolant flow rate through the liquid-to-liquid heat exchanger 352. After the vapor-liquid refrigerant mixture condenses within liquid-to-liquid heat exchanger 352, the condensed refrigerant is collected in a condensate reservoir 510 for pumping via a redundant pump assembly 520 back to the respective row of electronics racks via system coolant supply header 410. As shown in FIG. 5, a bypass line 530 with a bypass valve 531 may be employed to control the amount of system coolant fed back through the system coolant supply header, and hence, control temperature of system coolant delivered to the respective air-to-liquid heat exchangers mounted to the doors of the electronics racks.

Figure 6:
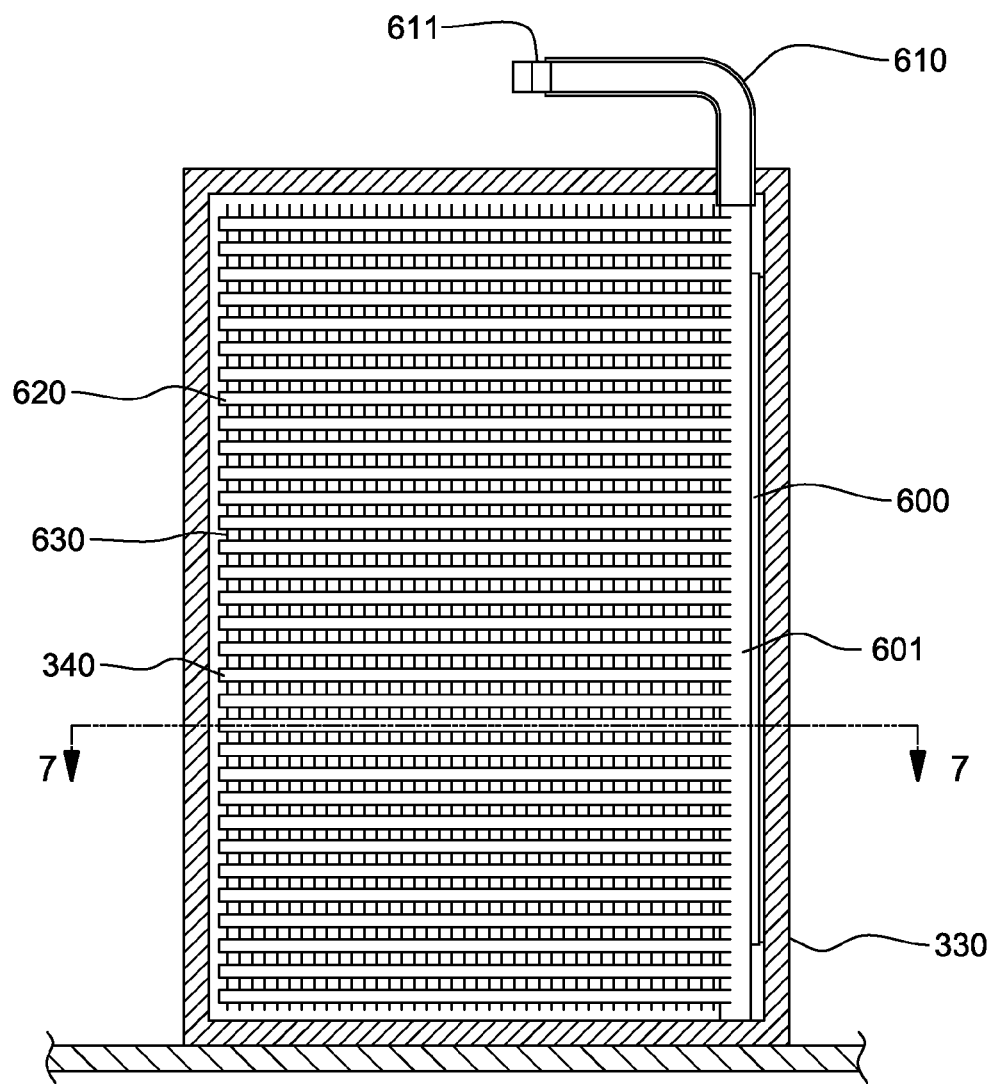
FIG. 6 is a partial cross-sectional, elevational view of one embodiment of an electronics rack door and cooling apparatus mounted thereto, taken along line 6-6 in FIG. 7, in accordance with an aspect of the present invention.
Figure 7:
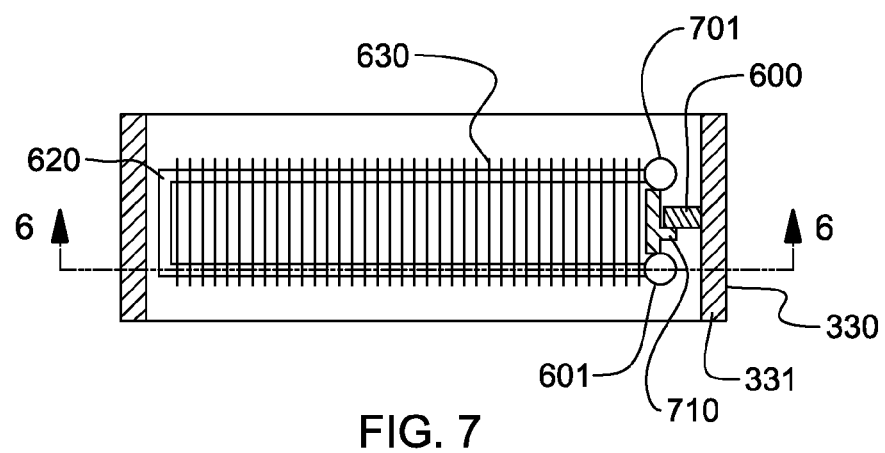
FIG. 7 is a cross-sectional, top plan view of the door and cooling apparatus of FIG. 6, taken along line 7-7 in FIG. 6, in accordance with an aspect of the present invention.

FIGS. 6 & 7 depict one embodiment of outlet door 330 supporting air-to-liquid heat exchanger 340, and system coolant inlet and outlet plenums 601, 701. Referring to both figures collectively, outlet door frame 331 supports a rigid flap 600, which attaches, for example, by brazing or soldering, to a plate 710 secured between the system coolant inlet plenum 601 and system coolant outlet plenum 701.

In FIG. 6, right angle bend 610 is shown disposed at the top of system coolant inlet plenum 601. This right angle bend defines a horizontal inlet plenum portion, which extends above the top of door 330. The coolant inlet to system coolant inlet plenum 601 is coupled to a connect coupling 611 for facilitating connection thereof to the respective supply hose, as described above. The air-to-liquid heat exchanger comprises a plurality of horizontally-oriented heat exchange tube sections 620. These heat exchange tube sections 620 each comprise a coolant channel having an inlet and an outlet, with each coolant channel being coupled to the system coolant inlet plenum 601 and each coolant channel outlet being coupled to the system coolant outlet plenum 701. A plurality of fins 630 are attached to horizontally-oriented heat exchange tube sections 620 for facilitating transfer of heat from air passing across the air-to-liquid heat exchanger to coolant flowing through the plurality of heat exchange tube sections 620. In one embodiment, the plurality of fins are vertically-oriented, rectangular fins attached to horizontally-oriented heat exchange tube sections 620.

Disclosed herein in one aspect is a cooling apparatus and method of fabrication with strain-relieved supply and return hoses circulating pumped refrigerant through a door-mounted heat exchanger, such as the above-described heat exchanger, and which allow the heat exchanger door to readily open and close. The stress relief and hose routing disclosed herein accommodate both the hose connections to the system coolant inlet and outlet plenums within the door, and to the system coolant supply and return headers of the data center within which the electronics rack is disposed. Sufficient compliance is provided by the stress relief and hose routing approaches disclosed to enable the cooling apparatus to be employed in a variety of different data centers. In one embodiment, sufficiently flexible (e.g., semi-rigid) braided hose, such as stainless steel braided hose, is used as the system coolant supply hose and as the system coolant return hose to connect a rack heat exchanger door in fluid communication with system coolant supply and return headers of the data center, while still allowing the rack door to be readily opened or closed (e.g., to facilitate servicing of the electronics rack). The flexible, braided hose is selected to enable a low force movement thereof along the rack top surface while still maintaining a routing of the hoses required by the geometry of the electronics rack and the supply and return fluid connect couplings at the ends of the hoses.

Generally stated, the cooling apparatus disclosed hereinbelow includes an air-to-liquid heat exchange assembly mounted to a rack door, which is vertically, hingedly mounted along a first edge to an electronics rack at one of an air inlet side or air outlet side of the rack, and wherein air moves through the rack from an air inlet side to an air outlet side. In the example described herein, the door is a rear door heat exchanger mounted to the air outlet side of the electronics rack, wherein the heat exchanger cools hot exhaust air egressing from the electronics rack before dispersing into the data center, thereby relieving demand on the data center's air conditioning. System coolant inlet and outlet plenums are mounted to the heat exchanger door along a second edge of the door, which is in opposing relation with and remote from the first edge of the door hingedly mounted to the electronics rack. This plenum mounting position advantageously reduces twisting of the system coolant supply and return hoses (connected to the plenums) during opening or closing of the door. This in turn minimizes stress on the hose connect couplings to the plenums.

The system coolant supply and return hoses are disposed above the electronics rack and are coupled at their (first) ends to the system coolant inlet and outlet plenums and at their other (second) ends to the system coolant supply and return headers, respectively, of the data center. As noted, the system coolant supply and return hoses are sufficiently flexible and of sufficient length to allow for opening and closing of the door. A stress relief structure is attached to the top of the door and clamps to the system coolant supply and return hoses to hold the first ends thereof in fixed parallel relation to each other on top of the door to relieve stress on the connect couplings at the first ends of the hoses to the plenums during opening or closing of the door. Similarly, supply and return manifold stress relief structures are provided at the second ends of the supply and return hoses to relieve stress on the connect couplings at the second ends of the hoses to the header structures during opening or closing of the door. In addition, one or more retention loops are mounted to a support plate attached to an upper portion of the electronics rack. These retention loops are sized to receive the system coolant supply hose and/or system coolant return hose and are of sufficient diameter to allow for translation and rotational movement of the semi-flexible supply and return hose(s) during opening or closing of the door. The one or more retention loops facilitate (in one embodiment) constraining the system coolant supply hose and/or system coolant return hose on top of the electronic rack during opening or closing of the door.

Advantageously, the stress relief structures disclosed herein rigidly secure the ends of the system coolant supply and return hoses without interfering with the function of the door or the hoses as they move with opening or closing of the door. The stress relief structures also provide strain relief to the connect couplings to the plenums within the door, as well as to the system coolant supply and return headers. The stress relief structures protect the connect couplings at the ends of the hoses from stresses due to moving of the door, and thus, due to moving of the hoses, as well as stresses induced, for example, by the weight of the hose itself (e.g., where attached to the supply and return headers). Another strain relief feature is provided by the one or more retention loops mounted to the support plate attached to the upper portion of the electronics rack. This constraining mechanism constrains the hoses above the rack to minimize hose movement and flexing, without interfering with opening or closing of the door. The supply and return manifold stress relief structures also function as overhead hose clamps to provide support for the hose portions running perpendicular to the supply and return headers, while the stress relief structure attached to the upper portion of the door functions as a hose clamp to provide support for the hose portions running parallel to the top of the door. These stress relief structures are designed, in one embodiment, for ready mounting and clamping of the hoses between two portions of molded plastic relief structures. In addition, as explained further below, the hose lengths may be designed to accommodate system coolant supply and return headers mounted within a defined range above the top of the electronics racks, for example, 2-4 feet above the rack. A supply or return hose length of 7 feet could accommodate such a range.

By way of specific example, FIGS. 8A & 8B depict one embodiment of an electronics rack door 800 with a cooling apparatus mounted thereto, in accordance with an aspect of the present invention. This cooling apparatus includes an air-to-liquid heat exchanger 815 across which exhausting air from the air outlet side of the electronics rack (not shown) flows. As illustrated, air-to-liquid heat exchanger 815 is disposed within an opening in a door frame 810 which vertically mounts along a first edge 811 to the electronics rack. The cooling apparatus includes a system coolant inlet plenum 820 and system coolant outlet plenum 825 which extend vertically into and along a second edge 812 of heat exchanger door 800. As illustrated, second edge 812 of heat exchanger door 800 is in opposing relation to first edge 811, which hingedly mounts to the electronics rack. Thus, the system coolant inlet and outlet plenums 820, 825 are disposed remote from the edge of the heat exchanger door mounted to the electronics rack. As noted, this advantageously reduces stress on the system coolant supply and return hoses (described further below), during opening or closing of the door, particularly when the first ends of the supply and return hoses are affixed in parallel relation on top of the electronic rack door to extend towards the first edge of the electronics rack door. As illustrated, system coolant inlet plenum 820 includes a coolant inlet 821 which has a connect coupling 822 for facilitating fluid tight connection to the system coolant supply hose (not shown). Similarly, system coolant outlet plenum 825 includes a coolant outlet 826 with a connect coupling 827 to facilitate fluid tight connection to a system coolant return hose, as described further below. In one embodiment, these connect couplings are quick connect couplings such as the commercially available quick connect couplings offered by Colder Products Company, of St. Paul, Minn., U.S.A., or Parker Hannifin, of Cleveland, Ohio, U.S.A.

FIGS. 8A & 8B also illustrate one embodiment of a stress relief structure 830 attached to an upper surface 813 of heat exchanger door 800. Stress relief structure 830 includes a first opening 831 and a second opening 832 which are respectively configured to receive the system coolant supply hose and the system coolant return hose, as illustrated further in FIGS. 9A & 9B.

Figure 9A:
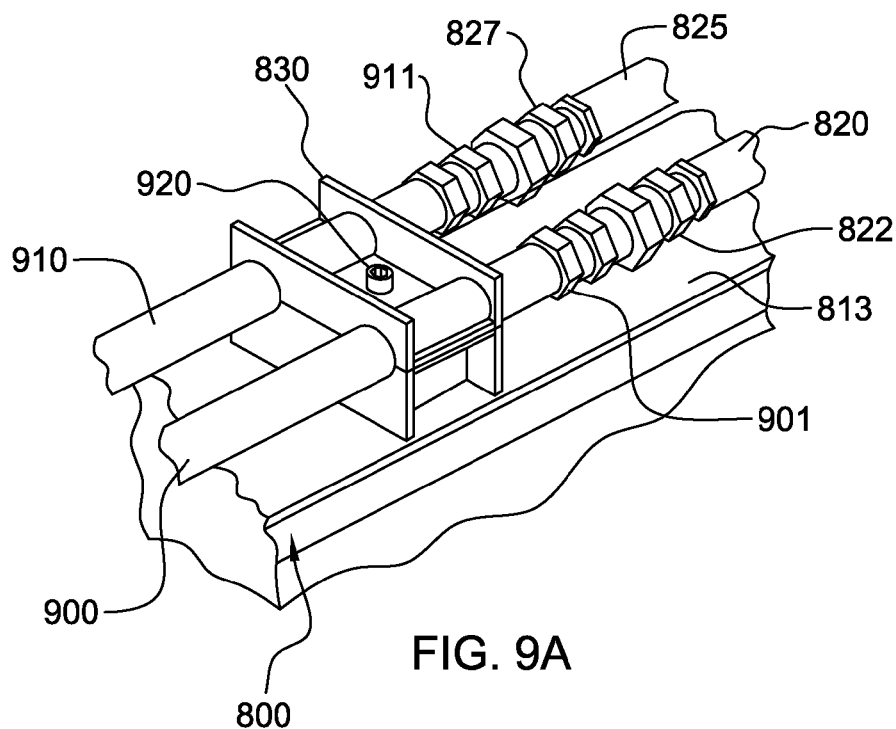
FIG. 9A is a partial isometric view of an electronics rack door and cooling apparatus mounted thereto illustrating one embodiment of a stress relief structure of the cooling apparatus, in accordance with an aspect of the present invention.
Figure 9B:
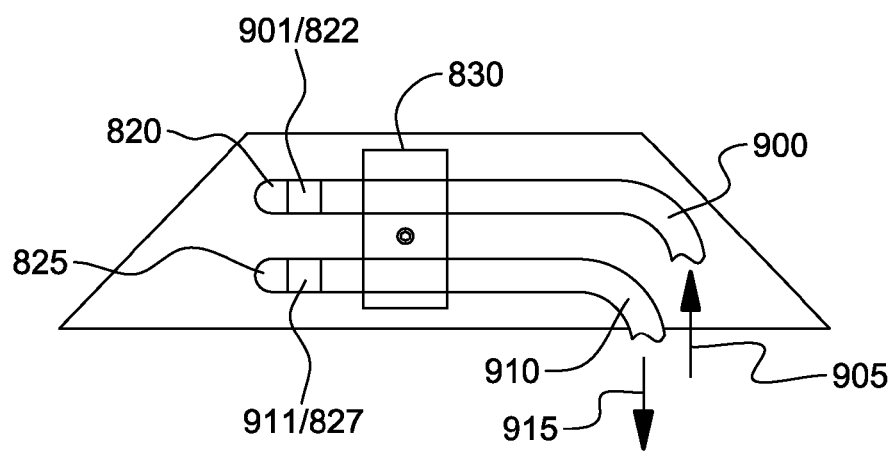
FIG. 9B is a plan view of the electronics rack door and cooling apparatus embodiment of FIG. 9A, in accordance with an aspect of the present invention.

Referring collectively to FIGS. 9A & 9B, stress relief structure 830 is shown attached to upper surface 813 of heat exchanger door 800. In this embodiment, system coolant supply hose 900 and system coolant return hose 910 are shown clamped within stress relief structure 830 and coupled in fluid communication via connect couplings 901 and 911 at the first ends thereof connected to connect couplings 822, 827 of system coolant inlet plenum 820 and system coolant outlet plenum 825, respectively. An attachment mechanism, such as a threaded connector 920 is used to securely clamp the upper portion of stress relief structure 830 to the lower portion of stress relief structure 830, with the hoses positioned within the first and second openings as illustrated. Within each opening, a compressible elastic material (not shown) is provided about the inner surface of the opening so that as the two halves of the stress relief structure clamp together about the hoses, the compressible material compresses against the hoses to securely, frictionally hold the supply and return hoses 900, 910 in fixed position on top of the electronics rack door without damaging the hoses.

In one detailed embodiment, the lower portion of the stress relief structure is affixed to the top of the heat exchanger door via, for example, two or more screws, and the top portion of the stress relief structure attaches to the bottom portion thereof using a single threaded connection 920 (i.e., once the hoses have been placed within the appropriately configured openings). The openings in the stress relief structure are configured and sized to rigidly clamp the respective hoses as the threaded connection forces the top portion of the structure against the bottom portion. This clamping structure provides strain relief to the hose connections at the inlet and outlet plenums as the heat exchanger door is opened or closed. Note that depending on the implementation, the diameter of system coolant supply hose 900 may be smaller than the diameter of system coolant return hose 910 since the coolant is, in one embodiment, two-phase refrigerant wherein latent heat transfer is employed in removing heat from exhausting air at the air outlet side of the electronics rack. To reduce pressure drop within such a two-phase system, the diameter of the system coolant return hose may be larger to accommodate the at least partially vaporized refrigerant. As illustrated in FIG. 9B, cooled system coolant 905 flows via system coolant supply hose 900 to system coolant inlet plenum 820 and heated system coolant 915 exhausts from system coolant outlet plenum 825 via system coolant return hose 910.

FIGS. 10A-10C illustrate one embodiment of supply and return manifold stress relief structures 1020, 1030, in accordance with an aspect of the present invention. Referring collectively to FIGS. 10A-10C, the second ends of system coolant supply and return hoses 900, 910 are illustrated with connect couplings 1021, 1031, respectively, to drop offs coupling the hoses in fluid communication with the respective system coolant supply and return headers 1000, 1010. As noted above with respect to the supply and return hoses, the supply and return headers may be differently sized (as illustrated) to accommodate more efficient return of the at least partially vaporized refrigerant, that is, in one embodiment, the inner diameter of system coolant return header 1010 is larger than the inner diameter of system coolant supply header 1000.

As shown, supply manifold stress relief structure 1020 receives (and clamps) at one end to system coolant supply hose 900 and at the other end to system coolant supply header 1000. The supply manifold stress relief structure 1020 is a rigid structure fabricated, in one embodiment, of two molded plastic portions (e.g., halves) which define the two openings at the ends thereof configured and oriented to accommodate the coolant supply hose and the system coolant supply header as illustrated. A threaded attachment mechanism 1040 is used to connect the two portions together and clamp the supply manifold stress relief structure about system coolant supply hose 900 and about system coolant supply header 1000 to hold in fixed position the second end of the hose, and more particularly, connect coupling 1021 to the supply header.

Similarly, return manifold stress relief structure 1030 is fabricated, in one embodiment, as a two-piece clamp formed of molded plastic which when assembled, rigidly holds the second end of system coolant return hose 910 in fixed position relative to system coolant return header 1010, and thereby protects connect coupling 1031 at the second end of the return hose during opening or closing of the door. Return manifold stress relief structure 1030 is assembled by aligning the two portions (e.g., halves) of the structure with the ends thereof positioned around system coolant return hose 910 and system coolant return header 1010. A threaded connector 1040 applies a clamping force to the hose and header, which rigidly holds the return hose in fixed position relative to the return header, notwithstanding opening or closing of the heat exchanger door. Note that the supply and return manifold stress relief structures depicted in FIGS. 10A-10C are shown as angled brackets, by way of example only. Alternative configurations may also be employed provided that the second ends of the supply and return hoses are held in fixed position relative to the respective supply and return headers of the data center, both to relieve the weight of the hoses on the downward-depending connect couplings, and to provide stress relief during opening or closing of the heat exchanger door.

Note that within each opening of supply and return manifold stress relief structures 1020, 1030, a compressible, elastic material (not shown) may be provided about the inner surface of the opening so that as the two portions of the respective stress relief structure are clamped together about the respective hose and header, the compressible material compresses against the hose and header to securely, frictionally hold the hose and header in relative fixed position, without damaging either the flexible hose or the header.

As shown in phantom in FIG. 10C, one or more rigid members 1050 may also be provided to fix supply manifold stress relief structure 1020 to return manifold stress relief structure 1030. In the embodiment illustrated, rigid member 1050 is bolted 1051 to the supply and return manifold stress relief structures 1020, 1030 at the respective ends thereof receiving system coolant supply hose 900 and system coolant return hose 910. Advantageously, by providing one or more rigid members between the supply and return manifold stress relief structures, rigidity of the structures is improved, which limits any rotating of the structures along the axis of the headers with opening or closing of the door.

Figure 11A:
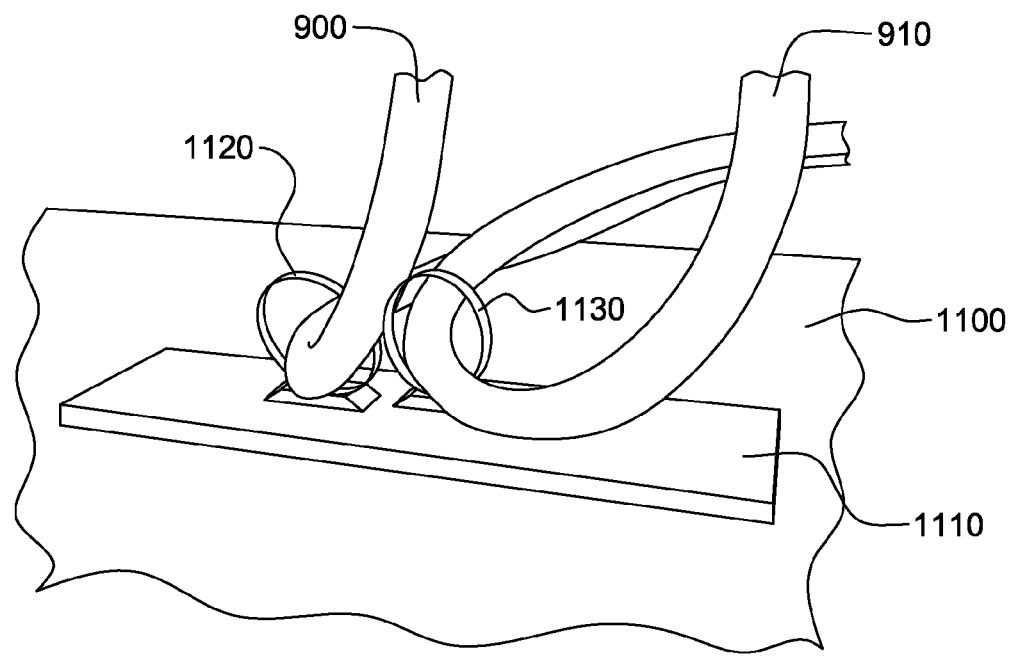
FIGS. 11A & 11B depict one embodiment of a constraining mechanism mounted to an upper portion of an electronics rack for constraining the system coolant supply hose and system coolant return hose during opening or closing of the door, in accordance with an aspect of the present invention.
Figure 11B:
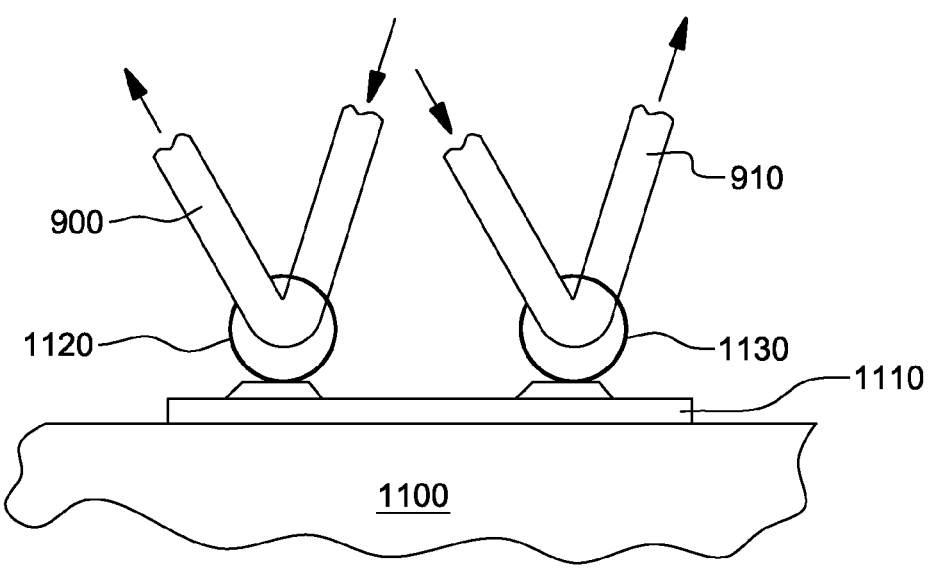

FIGS. 11A & 11B depict one embodiment of a constraining mechanism for facilitating retaining the supply and return hoses above the electronics rack. As illustrated, a support plate 1110 is provided and affixed (e.g., adhesively) to an upper surface of electronics rack 1100. Mounted to support plate 1110 are, in this embodiment, two retention loops 1120, 1130, each configured and sized to receive a respective one of the system coolant supply hose 900 and system coolant return hose 910. Note that retention loops 1120, 1130 are sufficiently sized to allow for translational and rotational movement of the respective hose with opening or closing of the heat exchanger door. In an alternate embodiment, more than two retention loops may be provided for constraining movement of the hoses at multiple locations on top of the electronics rack, or a single retention loop could be used through which both the supply and return hoses are constrained to facilitate maintaining the hoses above the electronics rack.

FIGS. 12A & 12B illustrate the concept that the supply and return headers 1000, 1010 may be disposed at different heights above the top of electronics rack 1100. In both embodiments, the heat exchanger door 800 (comprising heat exchanger 815) is shown in closed position. In FIG. 12A, the supply and return headers 1000, 1010 are illustrated at a higher level relative to the top of the electronics rack than in FIG. 12B. In both implementations, the supply and return manifold stress relief structures 1020, 1030 fixedly clamp the second ends of the system coolant supply and return hoses 900, 910 relative to the system coolant supply and return headers 1000, 1010, and stress relief structure 830 affixes the first ends of the system coolant supply and return hoses 900, 910 in parallel relation on top of the top heat exchanger door 800.

Figure 13B:
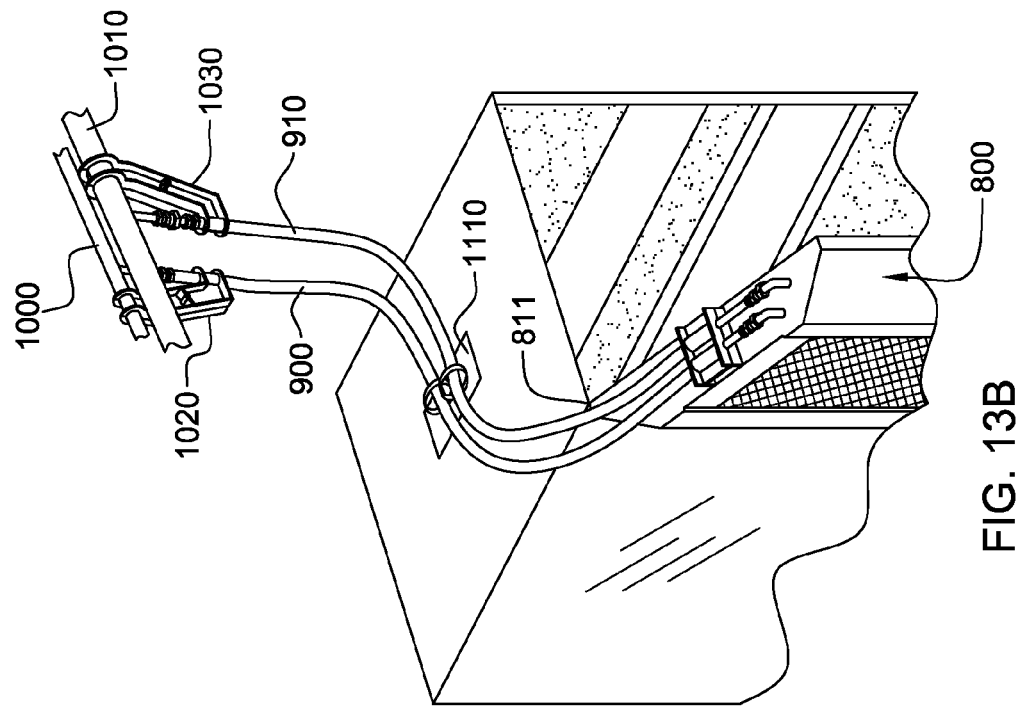
FIGS. 13A & 13B depict a further embodiment of an electronics rack, electronics rack door, and cooling apparatus mounted thereto showing the electronics rack door closed and open, respectively, in accordance with an aspect of the present invention.
Figure 13A:
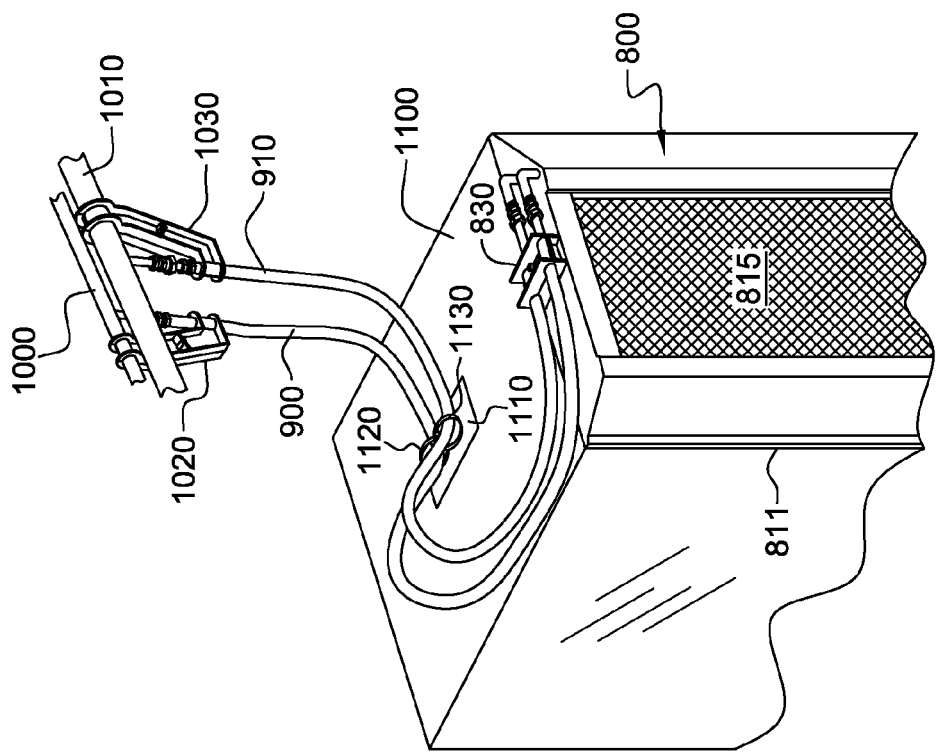

FIGS. 13A & 13B illustrate the cooling apparatus, in accordance with an aspect of the present invention, with the heat exchanger door shown closed and open, respectively. In FIG. 13A, heat exchanger door 800 is shown with first edge 811 thereof hingedly mounted to, for example, the air outlet side of electronics rack 1100. As noted above, heat exchanger door 800 includes an air-to-liquid heat exchanger 815 disposed so that exhausting air from the electronics rack flows across the heat exchanger. Stress relief structure 830 is mounted to the top portion of heat exchanger door 800 to hold in parallel fixed position the first ends of the system coolant supply and return hoses 900, 910 on top of the door to relieve strain on the connect couplings at the first ends thereof to the system coolant inlet and outlet plenums as the door is opened or closed. The connect couplings at the second ends of the system coolant supply and return hoses are held in fixed position relative to the system coolant supply and return headers 1000, 1010 via the respective supply and return manifold stress relief structures 1020, 1030, as described above. These supply and return manifold stress relief structures protect the connect couplings at the second ends of the hoses from the weight of the hoses, as well as from any strain resulting from opening or closing of the door. A constraining mechanism such as described above in connection with FIGS. 1A & 1B is also shown, with a support plate 1110 thereof affixed to the upper surface of the electronics rack, and two retention loops 1120, 1130 provided for constraining movement of the supply and return hoses as the heat exchanger door is opened or closed. The heat exchanger door is illustrated in the open position in FIG. 13B with the position of the supply and return hoses shown maintained above the electronics rack and the connect couplings at the ends of the hoses being protected from stress resulting from the opening of the heat exchanger door 800. Note that as shown in FIG. 13B, portions of the supply and return hoses at the first ends thereof are in parallel fixed relation on top of the heat exchanger door and run towards and substantially over first edge 811 of the heat exchanger door as the door is opened. This arrangement serves to minimize twisting forces on the hoses with opening or closing of the door.

Although embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A cooling apparatus for an electronics rack, the apparatus comprising:
   an air-to-liquid heat exchange assembly mounted to a door, the door being vertically, hingedly mounted along a first edge to the electronics rack at one of an air inlet side or an air outlet side thereof, wherein air moves through the electronics rack from the air inlet side to the air outlet side;
   a system coolant inlet plenum and a system coolant outlet plenum mounted to the door along a second edge thereof in opposing relation with and remote from the first edge of the door hingedly mounted to the electronics rack, the system coolant inlet plenum and the system coolant outlet plenum being in fluid communication with the air-to-liquid heat exchange assembly and facilitating passage of system coolant therethrough, the system coolant inlet plenum comprising a coolant inlet and the system coolant outlet plenum comprising a coolant outlet;
   a system coolant supply hose and a system coolant return hose disposed above the electronics rack, the system coolant supply hose being coupled at a first end to the coolant inlet of the system coolant inlet plenum and at a second end to a system coolant supply header of a data center containing the electronics rack, and the system coolant return hose being coupled at a first end to the coolant outlet of the system coolant outlet plenum and at a second end to a system coolant return header of the data center, wherein the system coolant supply hose and system coolant return hose are each sufficiently flexible and of sufficient length to allow for opening and closing of the door; and
   a stress relief structure attached to an upper portion of the door and clamped to the system coolant supply hose and to the system coolant return hose to hold the first ends thereof in fixed relation to each other at the upper portion of the door and to relieve stress on connect couplings at the first ends thereof to the coolant inlet and coolant outlet, respectively, of the system coolant inlet and outlet plenums during opening or closing of the door.

2. The cooling apparatus of claim 1, further comprising at least one manifold stress relief structure coupling at least one of the system coolant supply hose to the system coolant supply header adjacent to the second end thereof, or the system coolant return hose to the system coolant return header adjacent to the second end thereof, wherein the at least one manifold stress relief structure relieves stress on at least one connect coupling at least one of the second end of the system coolant supply hose or the second end of the system coolant return hose during opening or closing of the door.

3. The cooling apparatus of claim 1, further comprising a supply manifold stress relief structure clamping the system coolant supply hose to the system coolant supply header adjacent to the second end thereof, and a return manifold stress relief structure clamping the system coolant return hose to the system coolant return header adjacent to the second end thereof, wherein the supply manifold stress relief structure and the return manifold stress relief structure relieve stress on connect couplings at the second ends thereof to the system coolant supply and return headers, respectively, during opening or closing of the door.

4. The cooling apparatus of claim 3, wherein the supply manifold stress relief structure comprises an opening sized to engagably receive the system coolant supply hose and the return manifold stress relief structure comprises an opening sized to engagably receive the system coolant return hose, wherein the system coolant is a two-phase refrigerant which at least partially vaporizes within the air-to-liquid heat exchange assembly and the system coolant return hose has a larger hose diameter than a hose diameter of the system coolant supply hose.

5. The cooling apparatus of claim 3, wherein the supply manifold stress relief structure comprises a first angled bracket which clamps at a first end to the system coolant supply hose and at a second end to the system coolant supply header for holding the connect coupling at the second end of the system coolant supply hose substantially fixed during open or closing of the door, and wherein the return manifold stress relief structure comprises a second angled bracket which clamps at a first end thereof to the system coolant return hose and at a second end to the system coolant return header for holding the connect coupling at the second end of the system coolant return hose substantially fixed during opening or closing of the door.

6. The cooling apparatus of claim 5, wherein the first angled bracket and the second angled bracket each comprise a compressible material at the first end thereof which at least partially surrounds and compresses against the system coolant supply hose or system coolant return hose, respectively, when the first and second angled brackets are clamped thereto.

7. The cooling apparatus of claim 1, wherein the stress relief structure further comprises a first opening configured to receive the system coolant supply hose and a second opening configured to receive the system coolant return hose, wherein the stress relief structure further comprises compressible material within the first opening and compressible material within the second opening, the compressible material being at least partially compressed against the system coolant supply hose within the first opening of the stress relief structure and at least partially compressed against the system coolant return hose within the second opening of the stress relief structure, wherein the compressible material facilitates holding the system coolant supply hose and the system coolant return hose in fixed position within the stress relief structure during opening or closing of the door.

8. The cooling apparatus of claim 7, wherein the system coolant is a two-phase coolant which at least partially vaporizes within the air-to-liquid heat exchanger, and wherein the system coolant return hose has a larger hose diameter than a hose diameter of the system coolant supply hose and the second opening in the stress relief structure is larger than the first opening in the stress relief structure, and wherein the stress relief structure clamps the first ends of the system coolant supply hose and the system coolant return hose in parallel fixed relation on a top surface of the door.

9. The cooling apparatus of claim 1, further comprising at least one retention loop mounted to a support plate attached to an upper portion of the electronics rack, the at least one retention loop being configured to receive at least one hose of the system coolant supply hose or system coolant return hose and being of sufficient size to allow for translational and rotational movement of the at least one hose during opening or closing of the door, the at least one retention loop constraining the at least one hose to the upper portion of the electronics rack during opening or closing of the door.

10. The cooling apparatus of claim 1, further comprising a first retention loop mounted to the support plate and second retention loop mounted to the support plate, the first retention loop being configured to accommodate the system coolant supply hose and the second retention loop being configured to accommodate the system coolant return hose, and wherein the first retention loop and the second retention loop are configured to allow for translational and rotational movement of the system coolant supply hose and the system coolant return hose, respectively, during opening or closing of the door, the first retention loop and the second retention loop constraining the system coolant supply hose and the system coolant return hose to the upper portion of the electronics rack during opening or closing of the door.

11. A cooled electronics system comprising:
an electronics rack, the electronics rack comprising:
an air inlet side and air outlet side, the air inlet and air outlet sides respectively enabling ingress and egress of external air;
at least one electronics subsystem requiring cooling;
at least one air-moving device, the at least one air-moving device being capable of causing external air to flow from the air inlet side of the electronics rack across the at least one electronics subsystem, to the air outlet side of the electronics rack; and
an outlet door hingedly mounted along a first edge thereof to the electronics rack at the air outlet side of the electronics rack, the outlet door having an opening therein allowing egress of air from the electronics rack;
a cooling apparatus for the electronics rack, the cooling apparatus comprising:
an air-to-liquid heat exchange assembly mounted to reside within the opening in the outlet door;
a system coolant inlet plenum and a system coolant outlet plenum mounted to the outlet door along a second edge thereof in opposing relation with and remote from the first edge of the outlet door hingedly mounted to the electronics rack, the system coolant inlet plenum and the system coolant outlet plenum being in fluid communication with the air-to-liquid heat exchange assembly and facilitating passage of system coolant therethrough, the system coolant inlet plenum comprising a coolant inlet and the system coolant outlet plenum comprising a coolant outlet;
a system coolant supply hose and a system coolant return hose disposed above the electronics rack, the system coolant supply hose being coupled at a first end to the coolant inlet of the system coolant inlet plenum and at a second end to a system coolant supply header of a data center containing the electronics rack, the system coolant return hose being coupled at a first end to the coolant outlet of the system coolant outlet plenum and at a second end to a system coolant return header of the data center, wherein the system coolant supply hose and the system coolant return hose are each sufficiently flexible and of sufficient length to allow for opening or closing of the outlet door; and
a stress relief structure attached to an upper portion of the outlet door and clamped to the system coolant supply hose and the system coolant return hose to hold the first ends thereof in fixed relation to each other at the upper portion of the outlet door and to relieve stress on connect couplings at the first ends thereof to the coolant inlet and the coolant outlet, respectively, of the system coolant inlet and outlet plenums during opening or closing of the outlet door.

12. The cooled electronics system of claim 11, wherein system coolant is supplied to the system coolant inlet plenum via the system coolant supply hose and system coolant is exhausted from the system coolant outlet plenum via the system coolant return hose, and wherein the system coolant is a two-phase refrigerant which partially vaporizes within the air-to-liquid heat exchange assembly, and wherein the system coolant return hose has a larger hose diameter than a hose diameter of the system coolant supply hose, and the stress relief structure comprises a first opening configured to engagably receive the system coolant supply hose and a second opening configured to engagably receive the system coolant return hose, wherein the second opening is larger than the first opening.

13. The cooled electronics system of claim 12, wherein the stress relief structure further comprises a compressible material disposed within a first opening and compressible material disposed within a second opening thereof, the compressible materials being at least partially compressed against the system coolant supply hose and against the system coolant return hose engagably clamped by the stress relief structure within the first opening and the second opening, respectively.

14. The cooled electronics system of claim 11, wherein the system coolant inlet plenum extends vertically within the outlet door along the second edge thereof and the system coolant outlet plenum extends vertically within the outlet door along the second edge thereof, and wherein a coolant inlet of the system coolant inlet plenum is at a top portion thereof and the coolant outlet of the system coolant outlet plenum is at a top portion thereof, and wherein quick connect couplings couple the system coolant supply hose and the system coolant return hose to the coolant inlet and coolant outlet, respectively, of the system coolant inlet plenum and system coolant outlet plenum.

15. The cooled electronics system of claim 11, further comprising a supply manifold stress relief structure clamping the system coolant supply hose to the system coolant supply header adjacent to the second end thereof, and a return manifold stress relief structure clamping the system coolant return hose to the system coolant return header adjacent to the second end thereof, wherein the supply manifold stress relief structure and the return manifold stress relief structure relieve stress on connect couplings at the second ends thereof to the system coolant supply and return headers, respectively, during opening or closing of the door.

16. The cooled electronics system of claim 15, wherein the supply manifold stress relief structure comprises an opening sized to engagably receive the system coolant supply hose, and the return manifold stress relief structure comprises an opening sized to engagably receive the system coolant return hose, wherein the system coolant is a two-phase refrigerant which at least partially vaporizes within the air-to-liquid heat exchange assembly, and wherein the system coolant return hose has a larger hose diameter than a hose diameter of the system coolant supply hose, and wherein the openings of the supply manifold stress relief structure and the return manifold stress relief structure are configured with a compressible material which engages and compresses against the respective system coolant supply hose or system coolant return hose.

17. The cooled electronics system of claim 15, wherein the supply manifold stress relief structure comprises a first angled bracket which clamps at a first end to the system coolant supply hose and at a second end to the system coolant supply header to hold the connect couplings at the second end of the system coolant supply hose substantially fixed during opening or closing of the door, and wherein the return manifold stress relief structure comprises a second angled bracket which clamps at a first end thereof to the system coolant return hose and at a second end to the system coolant return header to hold the connect coupling at the second end of the system coolant return hose substantially fixed during opening or closing of the door.

18. The cooled electronics system of claim 11, further comprising at least one retention loop mounted to a support plate attached to an upper portion of the electronics rack, the at least one retention loop being configured to receive at least one hose of the system coolant supply hose or the system coolant return hose and being of sufficient size to allow for translational and rotational movement of the at least one hose during opening or closing of the door, the at least one retention loop constraining the at least one hose to the upper portion of the electronics rack during opening or closing of the door.

19. A method of fabricating a cooling apparatus for an electronics rack, the method comprising:
   mounting an air-to-liquid heat exchange assembly to a door of the electronics rack, the door being vertically, hingedly mounted along a first edge thereof to the electronics rack at one of an air inlet side or an air outlet side of the electronics rack, wherein air moves through the electronics rack from the air inlet side to the air outlet side;
   mounting a system coolant inlet plenum and a system coolant outlet plenum to the door along a second edge thereof in opposing relation with and remote from the first edge of the door hingedly mounted to the electronics rack, the system coolant inlet plenum and the system coolant outlet plenum being in fluid communication with the air-to-liquid heat exchange assembly for facilitating passage of system coolant therethrough, the system coolant inlet plenum comprising a coolant inlet and the system coolant outlet plenum comprising a coolant outlet;
   coupling a first end of a system coolant supply hose to the coolant inlet of the system coolant inlet plenum and a second end thereof to a system coolant supply header of a data center containing the electronics rack, and coupling a first end of a system coolant return hose to the coolant outlet of the system coolant outlet plenum and a second end thereof to a system coolant return header of the data center, wherein the system coolant supply hose and the system coolant return hose are sufficiently flexible and of sufficient length to allow opening or closing of the door; and
   attaching a stress relief structure to an upper portion of the door and clamping the stress relief structure to the system coolant supply hose and to the system coolant return hose to hold the first ends thereof in fixed relation to each other at the upper portion of the door and to relieve stress on connect couplings at the first ends thereof to the coolant inlet and the coolant outlet, respectively, of the system coolant inlet and outlet plenums during opening or closing of the door.

20. The method of claim 19, further comprising clamping a supply manifold stress relief structure to the system coolant supply hose at the second end thereof and to the system coolant supply header to fixedly hold the second end of the system coolant supply hose relative to the system coolant supply header, and clamping a return manifold stress relief structure to the system coolant return hose at the second end thereof and to the system coolant return header to fixedly hold the system coolant return hose at the second end relative to the system coolant return header, wherein the supply manifold stress relief structure comprises first and second portions which are configured to engagably clamp about the system coolant supply hose and the system coolant supply header, and wherein the return manifold stress relief structure comprises first and second portions which are configured to engagably clamp about the system coolant return hose and the system coolant return header, and wherein the system coolant return header has a larger diameter than a diameter of the system coolant supply header.

* * * * *